United States Patent
Sadhu et al.

(10) Patent No.: US 10,777,589 B2
(45) Date of Patent: Sep. 15, 2020

(54) PIXEL CROSSTALK CORRECTION

(71) Applicant: TEXAS INSTRUMENTS INCORPORATED, Dallas, TX (US)

(72) Inventors: Venkata Subhash Chandra Sadhu, Bengaluru (IN); Vamshi Krishna Reddy Ani Reddy, Karimnagar (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/285,299

(22) Filed: Feb. 26, 2019

(65) Prior Publication Data

US 2020/0212091 A1 Jul. 2, 2020

Related U.S. Application Data

(60) Provisional application No. 62/787,033, filed on Dec. 31, 2018.

(51) Int. Cl.
*H01L 27/146* (2006.01)
*H01L 31/0232* (2014.01)

(52) U.S. Cl.
CPC .. *H01L 27/14609* (2013.01); *H01L 27/14643* (2013.01); *H01L 31/02327* (2013.01)

(58) Field of Classification Search
None
See application file for complete search history.

(56) References Cited

U.S. PATENT DOCUMENTS

2016/0161610 A1\* 6/2016 Hiromi .................. G01S 7/481
250/341.8

\* cited by examiner

*Primary Examiner* — Mark T Monk
(74) *Attorney, Agent, or Firm* — John R. Pessetto; Charles A. Brill; Frank D. Cimino (57) ABSTRACT

A time-of-flight camera calibration system includes a time-of-flight camera and a calibration processor. The calibration processor is coupled to the time-of-flight camera. The calibration processor is configured to receive an input phase image captured by the time-of-flight camera, and generate a blurred phase image by applying a low pass filter to the input phase image. The calibration processor is also configured to generate a crosstalk correction matrix based on the blurred phase image, and provide the crosstalk correction matrix to the time-of-flight camera.

18 Claims, 4 Drawing Sheets

PIXEL CROSSTALK CORRECTION

CROSS-REFERENCE TO RELATED APPLICATION

This application claims priority to U.S. Provisional Application No. 62/787,033, entitled "Pixel Crosstalk Correction" filed Dec. 31, 2018, which is hereby incorporated herein by reference.

BACKGROUND

Depth imaging involves using a depth sensor to image a scene in three dimensions: x, y and z. The approaches to depth imaging include stereo-vision, structured light, and time-of-flight sensing. Stereo vision systems use two sensors that are spaced apart to capture an image of a scene. The different positions of corresponding pixels in the images captured by the two sensors provides the depth information. Structured light systems illuminate a scene with a spatially varying pattern. Depth variation in the scene produces distortion in an image of the scene captured by an image sensor, and the distortion is analyzed to extract depth information. Time-of-flight sensors operate by emitting light from a light source and detecting the light reflected by a surface of an object. The round-trip travel time of light emitted from the light source and reflected from the object back to the sensor is measured. With the time-of-flight information, and knowledge of the speed of light, the distance to the object can be determined.

SUMMARY

A time-of-flight camera calibrated to reduce phase distortion caused by inter-pixel crosstalk and system for calibrating the camera are disclosed herein. In one example, a time-of-flight camera calibration system includes a time-of-flight camera and a calibration processor. The calibration processor is coupled to the time-of-flight camera. The calibration processor is configured to receive an input phase image captured by the time-of-flight camera, and generate a blurred phase image by applying a low pass filter to the input phase image. The calibration processor is also configured to generate a crosstalk correction matrix based on the blurred phase image, and provide the crosstalk correction matrix to the time-of-flight camera.

In another example, a method for calibrating crosstalk correction in a time-of-flight camera includes capturing, by the time-of-flight camera, a first phase image. The first phase image is transmitted, by the time-of-flight camera, to a calibration processor. A blurred phase image is generated, by the calibration processor, by low-pass filtering the first phase image. A crosstalk correction matrix is generated, by the calibration processor, based on the blurred phase image. The crosstalk correction matrix is transmitted, by the calibration processor, to the time-of-flight camera.

In a further example, a camera includes light generation circuitry, a sensor array, a memory, and a phase correction processor. The sensor array includes a plurality of pixels. The memory is configured to store coefficients of a crosstalk correction matrix. The phase correction processor is coupled to the sensor array and the memory. The phase correction processor is configured to generate an output image by convolution of the crosstalk correction matrix and an image captured by the sensor array. The crosstalk correction matrix is configured to reduce inter-pixel crosstalk induced phase variance in the output image without substantially changing a magnitude of light measured at each pixel.

BRIEF DESCRIPTION OF THE DRAWINGS

For a detailed description of various examples, reference will now be made to the accompanying drawings in which.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

Time-of-flight cameras measure distance by transmitting a modulated light signal and measuring the phase difference between the transmitted light signal and a received reflection of the transmitted light signal. This received signal is treated as a complex value whose phase is the phase difference and the signal's magnitude is the amplitude of the reflected signal. The optical sensor employed in the time-of-flight camera includes an array of pixels. Each pixel leaks some of the photoelectrons collected due to incident light and these photoelectrons are subsequently collected by adjacent pixels. The electrons take a considerable amount of time to travel from a first pixel to a second pixel, which produces in the second pixel an attenuated and delayed form of the signal present at the first pixel. This pixel-to-pixel crosstalk leads to significant distortion in phase values when adjacent pixels have very different signal strengths. Thus, crosstalk from brighter to darker pixels produces distortion in the phase image when an image includes high spatial contrast.

The effects of pixel crosstalk can be modeled as a two-dimensional convolution of the ideal (undistorted) image with a point spread function matrix. The point spread function is the two-dimensional spatial impulse response of the camera's image sensor and includes complex components. Because the point spread function is a low pass filter, completely reversing the effects of the point spread function is a high pass function, the application of which adds unacceptable noise to the image.

Complete reversal of point spread function's effects involves correcting both phase and amplitude images. The sensor calibration disclosed herein addresses the principal problem of correcting the phase image and leaves the amplitude image substantially unchanged. Thus, implementations of the present disclosure produce an all pass filter in the camera to correct the phase image without adding noise to the magnitude image. The correction matrix applied in the all-pass filter is derived from the images of a plurality of calibration targets without directly evaluating the point spread function of the camera. A first of the calibration targets includes a small phase gradient and a large amplitude gradient. A second of the calibration targets includes a large phase gradient and a small amplitude gradient.

Phase gradient is small for a region of pixels if the difference between the time averaged phase value of adjacent pixels is less than the noise in phase data. Noise of phase data is defined as the temporal standard deviation in a statistically significant sample size. Large phase gradient is present if the phase difference between two pixels is many times the phase noise. An example is large phase gradient is a phase gradient that is five times the phase standard deviation. Amplitude gradient for a region of pixels is considered small if the ratio between time averaged amplitude value of adjacent pixels is less than the signal to noise ratio of the amplitude data in that region. Signal to noise ratio is defined as the average amplitude value divided by the standard deviation of amplitude in a statistically significant sample size. Amplitude gradient for a region of pixels is considered large if the ratio between time averaged amplitude value of adjacent pixels is greater than the signal to noise ratio of the amplitude data in that region.

The sensor calibration of the present disclosure corrects phase distortion in acquired images without directly evaluating the point spread function of the camera. Image data is collected from the calibration targets, and a spatial smoothing filter is applied to smooth the phase distortions in the image of the target having small phase gradients and produce a desired blurred image. Cameras of the present disclosure implement convolution of the phase distorted images captured by camera's sensor array with a correction matrix to produce the phase smoothed image. The calibration system represents the convolution as a large number of linear equations, and solves the large set of linear equations (e.g., by a least squares method). The solution to the linear equations produces the correction matrix as an all pass filter, rather than a high-pass filter, which the camera applies to undistort only the phase image while adding no noise to the image.

Figure 1A:
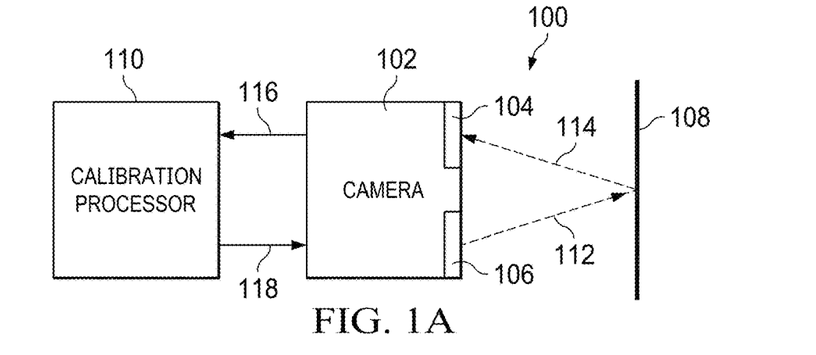
FIGS. 1A and 1B show block diagrams for an example time-of-flight camera calibration system in accordance with the present disclosure.
Figure 1B:
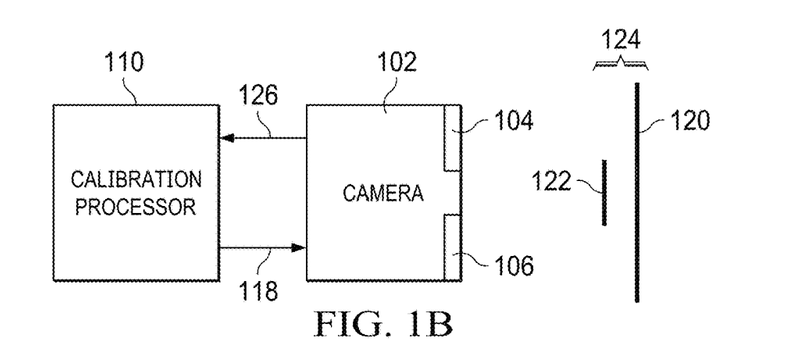

FIGS. 1A and 1B show block diagrams for an example time-of-flight camera calibration system 100 in accordance with the present disclosure. The time-of-flight camera calibration system 100 includes a small phase gradient calibration target in FIG. 1A and includes a large phase gradient calibration target in FIG. 1B. Referring first to FIG. 1A, the time-of-flight camera calibration system 100 includes a time-of-flight camera 102, a small phase gradient calibration target 108, and a calibration processor 110. The time-of-flight camera 102 includes a sensor array 104 and a light source 106. The light source 106 generates an optical signal 112 (e.g., a modulated infra-red signal) that illuminates the small phase gradient calibration target 108. The small phase gradient calibration target 108 includes a high-contrast pattern (i.e., a large amplitude gradient pattern) with areas that abruptly transition from light to dark. Optical signal 114 reflected by the small phase gradient calibration target 108 is captured by the sensor array 104. The sensor array 104 includes a plurality of optical sensors (e.g., photodiode pixels) arranged as rows and columns that detect the optical signal 114. Crosstalk from pixels imaging the light areas of the flat calibration surface 108 to pixels imaging the adjacent dark areas of the flat calibration surface 108 causes phase distortion that produces the appearance of increased distance to the flat calibration surface 108 at the boundaries of the dark areas.

Referring now to FIG. 1B, the large phase gradient calibration target 124 includes a foreground surface 122 that is spatially offset from a background surface 120 to create the large phase gradient. The colors of the foreground surface 122 and the background surface 120 are selected to provide a small amplitude gradient with consideration of the spatial offset between the foreground surface 122 and the background surface 120. For example, in some implementations the foreground surface 122 and the background surface 120 are respectively light gray and white in color. The light source 106 generates an optical signal (e.g., a modulated infra-red signal) that illuminates the large phase gradient calibration target 124. The optical signal reflected by the large phase gradient calibration target 124 is captured by the sensor array 104. Because of the small amplitude gradient of the large phase gradient calibration target 124 there is little or no measurable crosstalk induced phase distortion when imaging the large phase gradient calibration target 124.

The time-of-flight camera 102 is communicatively coupled to the calibration processor 110. For example, in some implementations, the time-of-flight camera 102 is coupled to the calibration processor 110 via a wired or wireless data communication network. The time-of-flight camera 102 transfers an image 116 of the small gradient calibration target 108 and an image 126 of the large gradient calibration target 124 captured by the time-of-flight camera 102 to the calibration processor 110. In practice, the time-of-flight camera 102 acquires and transfers a plurality of images of the small gradient calibration target 108 and the large gradient calibration target 124 to the calibration processor 110. The images 116 and 126 include magnitude and phase components, which are referred to herein as an amplitude image and a phase image. The calibration processor 110 processes the phase images to produce a correction matrix 118 that is applied to images acquired by the time-of-flight camera 102. The calibration processor 110 transfers the correction matrix 118 to the time-of-flight camera 102. After receipt of the correction matrix, the time-of-flight camera 102 performs a convolution of the correction matrix 118 with each image acquired by the sensor array 104 to reduce the effects of inter-pixel crosstalk on the phase image. Convolution with correction matrix 118 does not affect the amplitude image.

Figure 2:
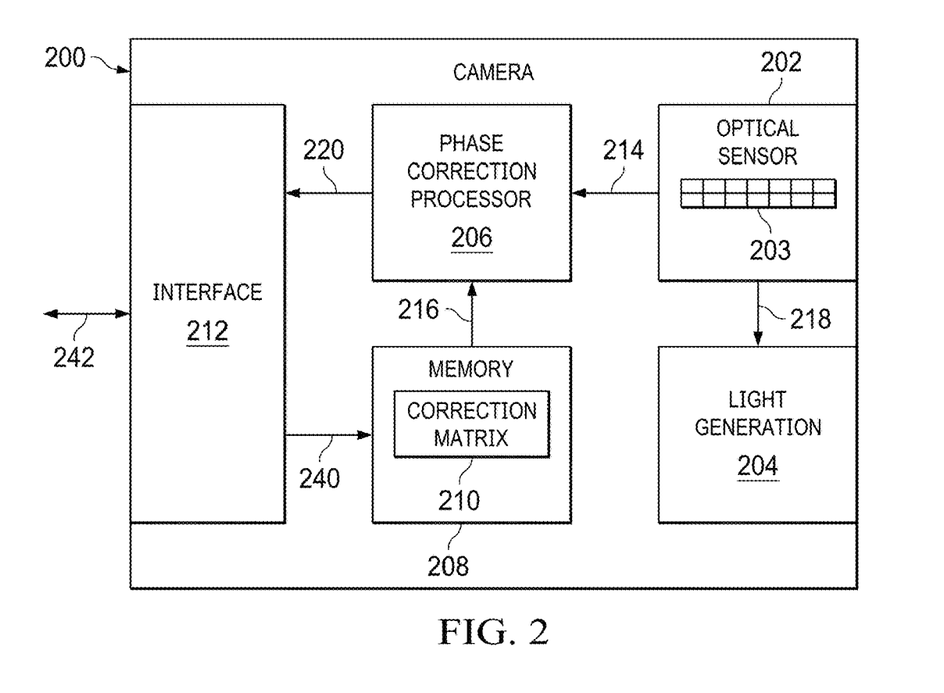
FIG. 2 shows a block diagram for an example time-of-flight camera that includes phase distortion correction in accordance with the present disclosure.

FIG. 2 shows a block diagram for an example time-of-flight camera 200 that includes phase distortion correction in accordance with the present disclosure. The time-of-flight camera 200 is an implementation of the time-of-flight camera 102. The time-of-flight camera 200 includes light generation circuitry 204, a phase correction processor 206, memory 208, and a communication interface 212. The optical sensor 202 includes a sensor array 203 that includes a plurality of photodiode pixels arranged as rows and columns to detected light. For example, an implementation of the sensor array 203 includes a 320 by 240 array of photodiode pixels. The time-of-flight camera 200 also includes various circuits that have been omitted from FIG. 2 in the interest of clarity. For example, an implementation of the time-of-flight camera 200 includes an analog-to-digital converter that digitizes the voltages captured on the sensor array 203 and associated signal conditioning circuitry, circuitry to control readout of the sensor array 203, etc.

The light generation circuitry 204 includes circuitry for controlling an illumination source, such as a laser diode or a light emitting diode. For example, an implementation of the light generation circuitry 204 includes modulation circuitry that generates a radio-frequency modulated signal that turns an illumination source on or off. In some implementations, the light generation circuitry 204 is communicatively coupled to the optical sensor 202. For example, a control signal 218 generated by the optical sensor 202 is provided to the light generation circuitry 204 so that timing of illumination control signal generation by the light generation circuitry 204 is synchronized with the acquisition of optical signals in the optical sensor 202.

The optical sensor 202 is coupled to the phase correction processor 206. The optical sensor 202 transfers images 214 captured by the optical sensor 202 to the phase correction processor 206 for phase correction. Each image 214 includes an amplitude image and a phase image, where the amplitude image specifies the magnitude of signal detected at each pixel of the sensor array 203, and the phase image specifies the relative phase of signal detected at each pixel of the sensor array 203. As explained above, crosstalk between the pixels of the optical sensor 202 produces distortion in the phase image at the boundaries of high contrast areas of a captured image, which produces errors in the measured distance to an imaged object. The phase correction processor 206 processes each image 214 to reduce the phase errors caused by inter-pixel crosstalk in the optical sensor 202.

The phase correction processor 206 is coupled to the memory 208. The memory 208 stores a correction matrix 210. The correction matrix 210 include coefficients that are applied to each phase image processed by the phase correction processor 206 to reduce phase distortion caused by inter-pixel crosstalk. The memory 208 is a non-volatile memory, such as an electrically erasable programmable read only memory (EEPROM), FLASH memory, or other non-volatile memory device. The phase correction processor 206 includes arithmetic circuitry, such as adders, multipliers, and sequencing circuitry that execute the convolution of the correction matrix 210 and the images 214.

The phase correction processor 206 and the memory 208 are coupled to the communication interface 212. The communication interface 212 includes circuitry that allows for transfer of information, including images 220, from the time-of-flight camera 200 to external systems, and transfer of information, including the correction matrix 240 from an external system to the time-of-flight camera 200 for storage in the memory 208. In some implementations, the communication interface 212 implements a camera serial interface as specified by the Mobile Industry Processor Interface Alliance (MIPI CSI-2).

Figure 3:
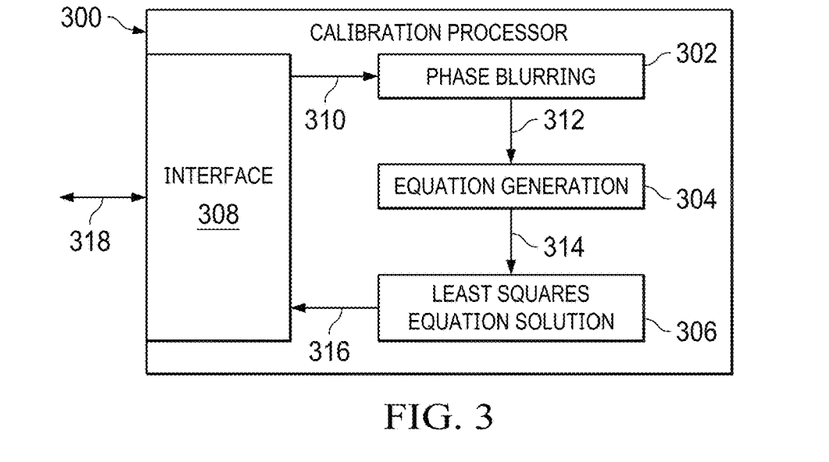
FIG. 3 shows a block diagram for an example calibration processor for generating a phase correction matrix that is applied to correct phase distortion in a time-of-flight camera in accordance with the present disclosure.

FIG. 3 shows a block diagram for an example calibration processor 300 for generating a phase correction matrix 240 that is applied to correct phase distortion in the time-of-flight camera 200 in accordance with the present disclosure. The calibration processor 300 is an implementation of the calibration processor 110. Some examples of the calibration processor 300 are implemented using a general-purpose computer, such as desktop, laptop, or rack-mounted computer that includes a processor (e.g., a general purpose microprocessor, a digital signal processor, a graphics processor, etc.) for execution of instructions that cause the processor to generate the phase correction matrix 240, and memory (e.g., dynamic random access memory) for storage of instructions, phase images, and other information coupled to the processor.

The calibration processor 300 includes a communication interface 308 for communicating with the time-of-flight camera 200. The calibration processor 300 receives phase images 310 from the time-of-flight camera 200 and provides a phase correction matrix 316 to the time-of-flight camera 200 via the communication interface 308. In some implementations, the communication interface 308 implements a camera serial interface as specified by the Mobile Industry Processor Interface Alliance (MIPI CSI-2).

The calibration processor 300 includes phase blurring logic 302, equation generation logic 304, and least squares equation solution logic 306. The phase blurring logic 302, the equation generation logic 304, and the least squares equation solution logic 306 are implemented by a processor executing instructions that cause the processor to perform the desired functions in some implementations of the calibration processor 300. The phase blurring logic 302 receives the phase images 310 from the time-of-flight camera 200. The phase images 310 includes phase coefficients of images of the small gradient calibration target 108 and images of the large gradient calibration target 124. The phase images 310 corresponding to images of the small gradient calibration target 108 include phase distortion caused by inter-pixel crosstalk at the boundaries of the imaged high contrast areas. The phase blurring logic 302 blurs (i.e., smooths) the phase images 310 corresponding to images of the small gradient calibration target 108 by applying a spatial low pass filter to the phase images 310 corresponding to images of the small gradient calibration target 108 to produce a blurred phase image 312. Some implementations of the phase blurring logic 302 apply a Gaussian kernel to low pass filter the phase images 310 corresponding to images of the small gradient calibration target 108. Blurring the phase images 310 corresponding to images of the small gradient calibration target 108 reduces the variation in the phase values that constitute the phase images 310 corresponding to images of the small gradient calibration target 108 such that the phase gradients of the blurred phase image 312 is small as defined herein. Thus, the phase blurring logic 302 reduces the effects of the crosstalk induced phase distortion at the high contrast boundaries of the phase images 310 corresponding to images of the small gradient calibration target 108 by averaging across multiple pixels. The blurred phase image 312 is provided to the equation generation logic 304.

The phase images 310 corresponding to the large gradient calibration target 124 are not blurred by the phase blurring logic 302. Rather, these images are included in generation of the correction matrix to ensure that the correction matrix does not blur all captured phase images.

The equation generation logic 304 generates a plurality of linear equations 314 that describe the blurring of the phase images 310 corresponding to images of the small gradient calibration target 108 to produce the blurred phase image 312, and the phase images 310 corresponding to the large gradient calibration target 124. That is, the equation generation logic 304 generates a plurality of linear equations 314 that describe the convolution of the phase images 310 with an unknown correction matrix to produce the blurred phase image 312 and pass the phase images 310 corresponding to the large gradient calibration target 124. The number of linear equations 314 produced by the equation generation logic 304 is equal to (m−p+1)(n−q+1) where:

the size of each phase image 310 is: m×n; and size of the low pass filter applied in the phase blurring logic 302 is: p×q.

That is, the equation generation logic 304 generates a linear equation 314 to describe the filtering of each phase value of the phase image 310 (i.e., each pixel of the sensor array 203). Each of the linear equations 314 includes a number of variables equal to the number of coefficients of the correction matrix 316. Each variable of the linear equations is a coefficient of the correction matrix 316. The equation generation logic 304 provides the linear equations 314 to the least squares equation solution logic 306.

The least squares equation solution logic 306 applies a least squares method to solve for (e.g., estimate the values of) the variables of the linear equations 314. The values of the variables of the linear equations 314 estimated by least squares are the coefficients of the correction matrix 316. Some implementations of the least squares equation solution logic 306 apply a linear least squares analysis, a simultaneous iterative reconstruction technique, or other regression analysis method to estimate the coefficients of the correction matrix 316. The correction matrix 316 is transferred to the time-of-flight camera 200, via the communication interface 308, for storage in the memory 208 and convolution with the images 214 captured by the optical sensor 202 by the phase correction processor 206.

Convolution of the images 214 and the correction matrix 210 comprises all-pass rather than high-pass filtering, where the all-pass filtering adjusts the phase values of the images 214 to reduce the phase distortion caused by inter-pixel crosstalk, and produces no change in the magnitude values of the images 214. Thus, calibration using the calibration processor 300 to generate a correction matrix 316 does not increase the noise in the phase corrected images 220 generated by the time-of-flight camera 200.

Figure 4:
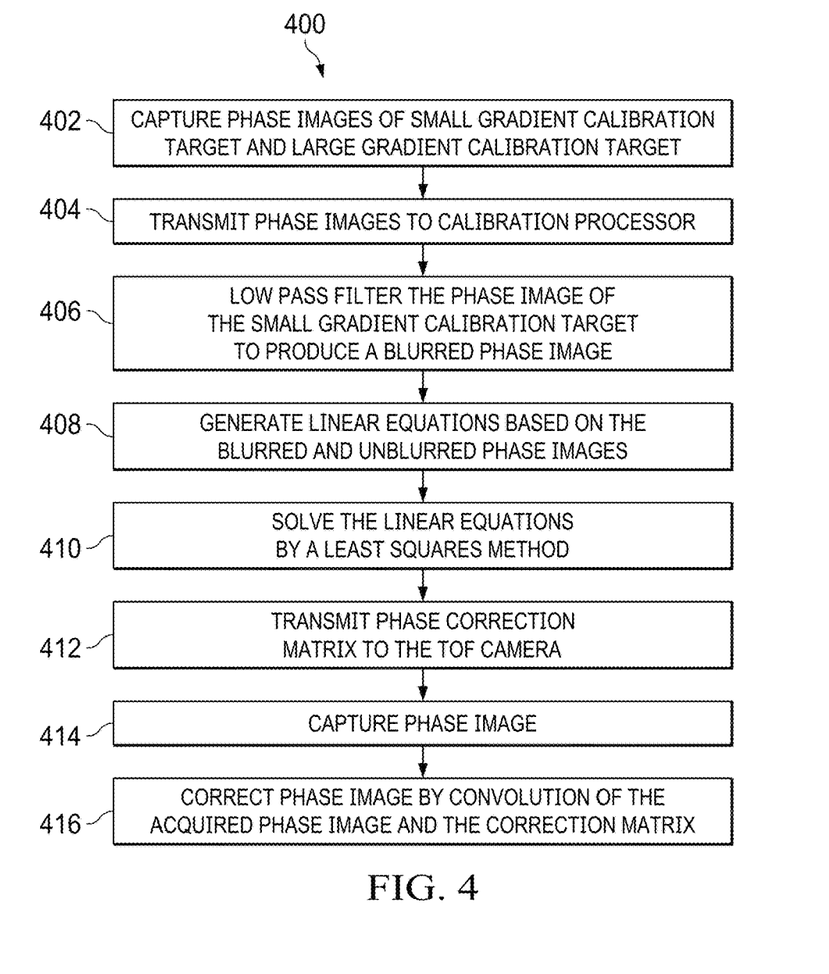
FIG. 4 shows a flow diagram for an example method for calibrating a time-of-flight camera in accordance with the present disclosure.

FIG. 4 shows a flow diagram for an example method 400 for calibrating a time-of-flight camera in accordance with the present disclosure. Though depicted sequentially as a matter of convenience, at least some of the actions shown can be performed in a different order and/or performed in parallel. Additionally, some implementations may perform only some of the actions shown.

In block 402, the time-of-flight camera 200 captures an image 116 of the small gradient calibration target 108 and an image 126 of the large gradient calibration target 124. The small gradient calibration target 108 includes areas of high contrast. Inter-pixel crosstalk in the time-of-flight camera 200 causes phase distortion at the boundaries of the areas of high contrast. The images 116 and 126 includes phase and magnitude components.

In block 404, the time-of-flight camera 200 transmits the phase components of the images 116 and 126 to the calibration processor 300 as the phase images 310.

In block 406, the calibration processor 300 smooths (blurs) the phase values of the phase image 310 corresponding to the small gradient calibration target 108 by applying a spatial low pass filter to the phase image 310. The low pass filtering reduces variation in the phase values of the phase image 310, which in turn reduces the effects of phase distortion caused by inter-pixel crosstalk in the sensor array 203. The image 126 is passed without low pass filtering.

In block 408, the calibration processor 300 generates a plurality of linear equations 314 that describe the image 126 of the large gradient calibration target 124 and the blurring of the phase image 310 corresponding to the small gradient calibration target 108 to produce the blurred phase image 312. That is, the calibration processor 300 generates a plurality of linear equations 314 that describe the convolution of the phase images 310 with an unknown correction matrix to produce the blurred phase image 312 and the unblurred image 126 of the large gradient calibration target 124. The number of linear equations 314 produced by the equation generation logic 304 is equal to (m−p+1)(n−q+1) where:

the size of first input phase image is: m×n; and the size of the spatial low pass filter applied in block 406 is: p×q.

That is, the equation generation logic 304 generates a linear equation 314 to describe the filtering of each phase value the phase image 310 (i.e., each pixel of the sensor array 203). Each of the linear equations 314 includes a number of variables equal to the number of coefficients of the correction matrix 316, and each variable of the linear equations is a coefficient of the correction matrix 316.

In block 410, the calibration processor 300 solves the linear equations 314 by a least squares or other linear regression analysis method to estimate a value for each variable of the linear equations 314. The values of the variables of the linear equations 314 estimated by least squares are the coefficients of the correction matrix 316.

In block 412, the calibration processor 300 transmits the correction matrix 316 to the time-of-flight camera 200, and the time-of-flight camera 200 stores the correction matrix 316 in the non-volatile memory 208.

In block 414, the time-of-flight camera 200 captures an image 214. The image 214 includes a phase image that includes distortion caused by inter-pixel crosstalk at the boundaries of high contrast areas of the image 214.

In block 416, the time-of-flight camera 200 corrects the phase image to reduce phase distortion caused by inter-pixel crosstalk. More specifically, the time-of-flight camera 200 generates a phase image as a convolution of the image 214 and the correction matrix 210 provided by the calibration processor 300 in block 412. Convolution of the image 214 and the correction matrix 210 reduces phase distortion in the phase corrected image 220 without creating noise in the corrected image 220.

Figure 5:
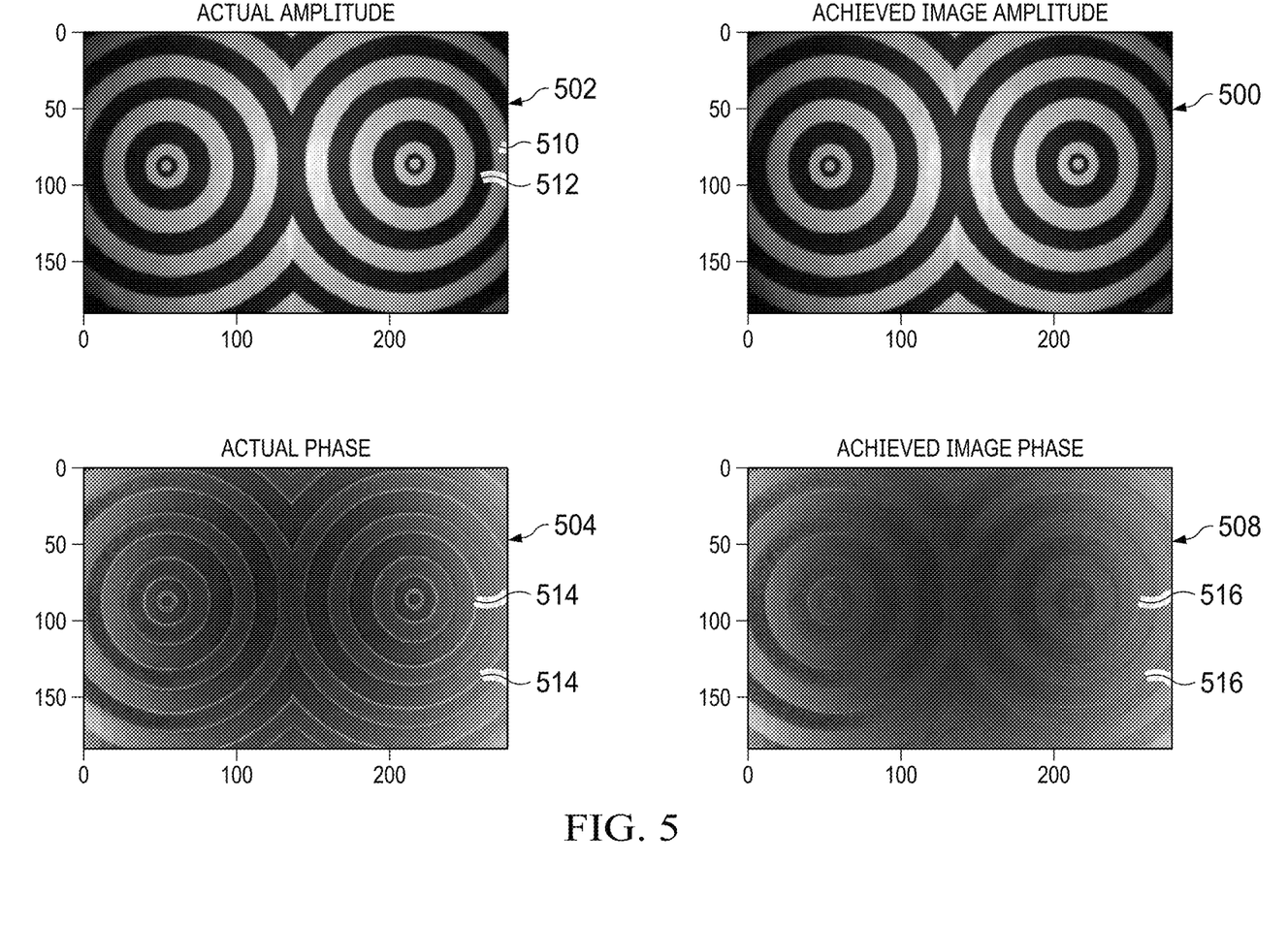
FIG. 5 shows amplitude and phase images of a small phase gradient calibration target before and after application of the crosstalk correction method of the present disclosure.

FIG. 5 shows amplitude and phase images of a small phase gradient calibration target before and after application of the crosstalk correction method of the present disclosure. The image 502 is an amplitude image comprising the magnitude components of the image 116. The image 504 is a phase image comprising the phase components of the image 116. The image 502 and the image 504 are components of the image 116 prior to phase correction processing by the phase correction processor 206. The image 502 includes high contrast areas 510 and 512. The image 504 includes phase distortions 514 at the boundaries of the high contrast areas 510 and 512 caused by crosstalk between the pixels imaging the area 510 and pixels imaging the area 512.

The image 500 is a version of the image 502 after phase correction processing by the phase correction processor 206. The image 508 is a version of the image 504 after phase correction processing by the phase correction processor 206. The image 500 is substantially the same as the image 502. In the image 508, the phase correction processing by the phase correction processor 206 has substantially reduced the phase distortions 516 at boundaries of the high contrast areas 510 and 512.

Figure 6:
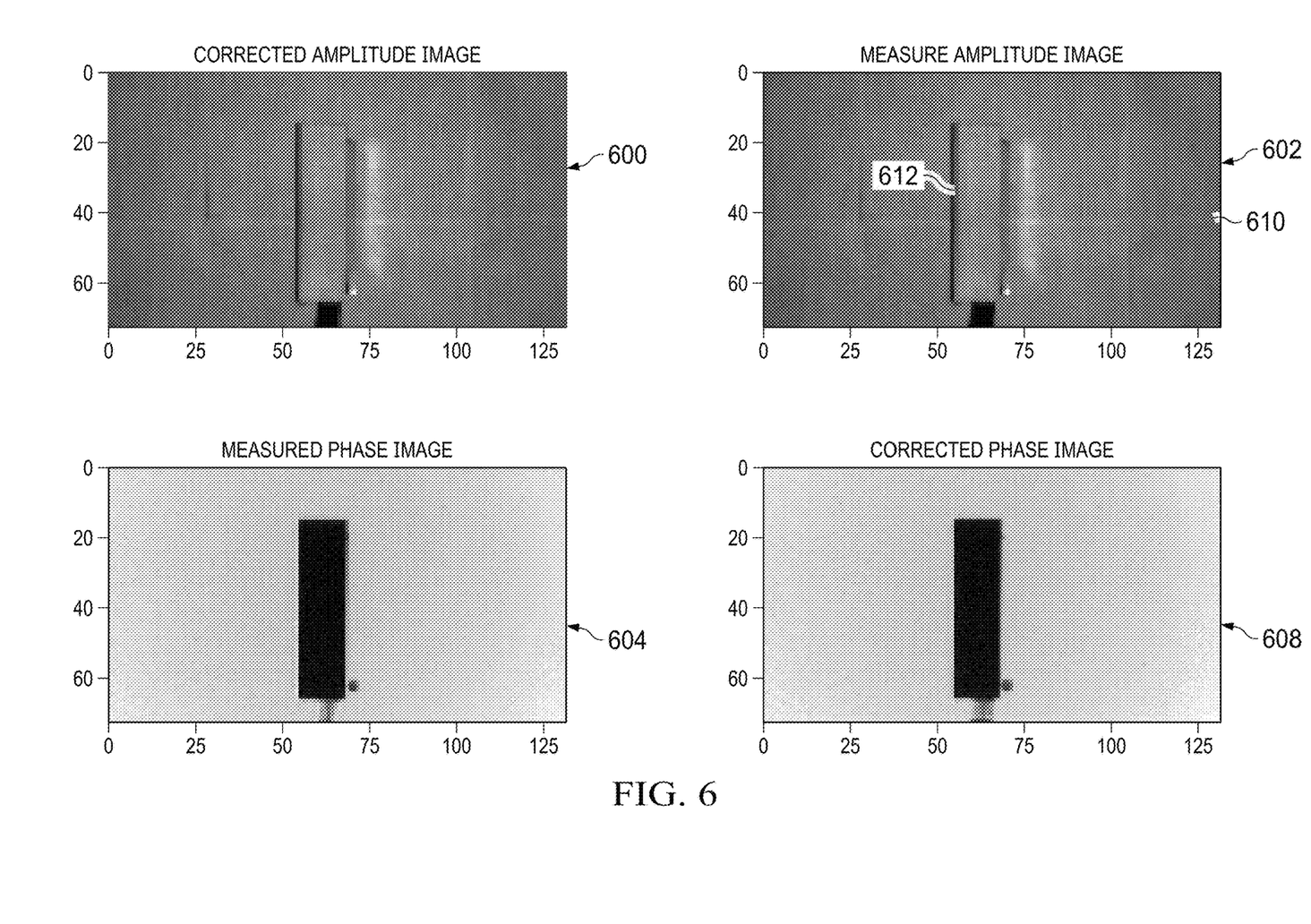
FIG. 6 shows amplitude and phase images of a large phase gradient calibration target before and after application of the crosstalk correction method of the present disclosure.

FIG. 6 shows amplitude and phase images of a large phase gradient calibration target before and after application of the crosstalk correction method of the present disclosure. The image 602 is an amplitude image comprising the magnitude components of the image 126. The image 604 is a phase image comprising the phase components of the image 126. The image 602 and the image 604 are components of the image 126 prior to phase correction processing by the phase correction processor 206. The image 602 includes areas 610 and 612 respectively corresponding to background surface 120 and foreground surface 122. The colors of the foreground surface 122 and the background surface 120 are selected to provide a small amplitude gradient. Because of the small amplitude gradient, the image 604 includes no phase distortions at the boundaries of the areas 610 and 612.

The image 600 is a version of the image 602 after phase correction processing by the phase correction processor 206. The image 608 is a version of the image 604 after phase correction processing by the phase correction processor 206. The image 600 is substantially the same as the image 602, and the image 608 is substantially the same as the image 604. Phase correction processing by the phase correction processor 206 has little or no effect on large phase gradient images.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A time-of-flight camera calibration system, comprising:
   a calibration processor couple to a time-of-flight camera, and configured to:
      receive an input phase image;
      generate a blurred phase image by applying a low pass filter to the input phase image;
      generate a crosstalk correction matrix based on the blurred phase image; and
      provide the crosstalk correction matrix.

2. The time-of-flight camera calibration system of claim 1, wherein the input phase image is a first input phase image, and the calibration processor is configured to:
   receive a second input phase image;
   pass the second phase image without low pass filtering; and;
   generate the crosstalk correction matrix based on the blurred phase image and the second input phase image.

3. The time-of-flight camera calibration system of claim 2, wherein the calibration processor is configured to convert the blurred phase image and the second input phase image to a plurality of linear equations.

4. The time-of-flight camera calibration system of claim 3, wherein a number of the linear equations is equal to $(m-p+1)(n-q+1)$ where:
   size of first input phase image is: m×n; and
   size of the low pass filter is: p×q.

5. The time of flight camera calibration system of claim 3, wherein each of the linear equations includes a number of variables equal to a number of coefficients of the crosstalk correction matrix.

6. The time-of-flight camera calibration system of claim 3, wherein the calibration processor is configured to solve the linear equations for coefficients of the crosstalk correction matrix.

7. The time-of-flight camera calibration system of claim 1, further comprising a calibration target with small phase gradients to be imaged by the time-of-flight camera to generate the input phase image.

8. The time-of-flight camera calibration system of claim 1, wherein the calibration processor is configured to spatially low pass filter the input image by convolving the input image with a gaussian kernel.

9. A method for calibrating crosstalk correction in a time-of-flight camera, comprising:
   capturing, by the time-of-flight camera, a first phase image;
   transmitting, by the time-of-flight camera, the first phase image to a calibration processor;
   generating, by the calibration processor, a blurred phase image by low-pass filtering the first phase image;
   generating, by the calibration processor, a crosstalk correction matrix based on the blurred phase image; and
   transmitting, by the calibration processor, the crosstalk correction matrix to the time-of-flight camera.

10. The method of claim 9, further comprising:
    capturing, by the time of flight camera, a second phase image;
    transmitting, by the time-of-flight camera, the second phase image to the calibration processor;
    passing, by the calibration processor, the second phase image without low pass filtering;
    generating, by the calibration processor, the crosstalk correction matrix based on the blurred phase image and the second phase image;
    wherein:
       capturing the first phase image comprises capturing an image of first calibration target having small phase gradients; and
       capturing the second phase image comprises capturing an image of a second calibration target having large phase gradients.

11. The method of claim 10, further comprising generating, by the calibration processor, a plurality of linear equations based on the blurred phase image and the second phase image.

12. The method of claim 11, wherein a number of the linear equations is equal to $(m-p+1)(n-q+1)$ where:
    size of first input phase image is: m×n; and
    size of the low pass filter is: p×q.

13. The method of claim 11, wherein each of the linear equations includes a number of variables equal to a number of coefficients of the crosstalk correction matrix, and each variable of the linear equations is a coefficient of the crosstalk correction matrix.

14. The method of claim 11, further comprising solving, by the calibration processor, the linear equations to generate coefficients of the crosstalk calibration matrix.

15. The method of claim 9, wherein the low pass filtering comprises convolution of the phase image with a gaussian kernel.

16. The method of claim 9, further comprising storing, by the time-of-flight camera, the crosstalk correction matrix, in a non-volatile memory of the time-of-flight camera.

17. The method of claim 9, further comprising:
    capturing, by the time-of-flight camera, a second phase image; and
    generating a corrected phase image by convolution of the crosstalk correction matrix and the second phase image.

18. The method of claim 9, wherein after the low-pass filtering, the blurred phase image includes only small phase gradients.

\* \* \* \* \*